US007747928B2

(12) United States Patent
Shinsho et al.

(10) Patent No.: US 7,747,928 B2
(45) Date of Patent: Jun. 29, 2010

(54) DIGITAL WIRELESS COMMUNICATION APPARATUS

(75) Inventors: Eiji Shinsho, Tokyo (JP); Shigeo Sato, Tokyo (JP)

(73) Assignee: Uniden Corporation, Tokyo (JP)

( * ) Notice: Subject to any disclaimer, the term of this patent is extended or adjusted under 35 U.S.C. 154(b) by 866 days.

(21) Appl. No.: 11/611,127

(22) Filed: Dec. 14, 2006

(65) Prior Publication Data

US 2008/0015849 A1 Jan. 17, 2008

(30) Foreign Application Priority Data

Jul. 11, 2006 (JP) ............................ 2006-190775

(51) Int. Cl.
*H03M 13/00* (2006.01)

(52) U.S. Cl. ........................ 714/774; 375/254; 375/245

(58) Field of Classification Search ................ 714/776; 375/254, 244
See application file for complete search history.

(56) References Cited

U.S. PATENT DOCUMENTS 4,751,736 A * 6/1988 Gupta et al. ................ 704/230
4,860,313 A * 8/1989 Shpiro ........................ 375/245
5,787,129 A * 7/1998 Willming .................... 375/346
6,680,986 B1 * 1/2004 Hemmati .................... 375/341
6,690,739 B1 * 2/2004 Mui ........................... 375/265
6,734,920 B2 * 5/2004 Ghosh et al. ................ 348/614
7,295,617 B2 * 11/2007 Shimotoyodome .......... 375/245
7,391,813 B2 * 6/2008 Shinsho ...................... 375/242
2001/0040927 A1 * 11/2001 Chu ........................... 375/254
2006/0029140 A1 * 2/2006 Shinsho ...................... 375/245

FOREIGN PATENT DOCUMENTS

JP 2004-050476 A 2/2006

OTHER PUBLICATIONS

ITU Association of Japan , "ITU-T Kankokushu G Series ", "The ITU Association of Japan", May 1, 1998, Publisher: , Published in: Kankokushu, Japan.

ITU Association of Japan , "ITU-T Kankokushu G Series", "The ITU Association of Japan", May 1, 1998, Publisher: , Published in: Kankokushu, Japan; (English Translation of Part of Document).

* cited by examiner

*Primary Examiner*—M. Mujtaba K Chaudry
(74) *Attorney, Agent, or Firm*—Steven J. Hultquist; Intellectual Property Technology Law

(57) ABSTRACT

A prediction signal calculator with a limit function is provided with a multiplier calculating a partial prediction signal composed of the product of a polar prediction coefficient for generating a regenerative signal and a quantized regenerative signal, a display conversion section for converting the partial prediction signal from floating point representation to an absolute value display, and a limiter executing processing for substituting limit values in the partial prediction signal satisfying overflow conditions during conversion of the partial prediction signal from floating point representation to an absolute value display in the event that the error detector determines that there are code errors in the audio data for a predetermined number of frames of the audio data.

2 Claims, 10 Drawing Sheets

FIG.2

| \| I(k) \| | 7 | 6 | 5 | 4 | 3 | 2 | 1 | 0 |
|---|---|---|---|---|---|---|---|---|
| W[I(k)] | 70.13 | 22.19 | 12.38 | 7.00 | 4.00 | 2.56 | 1.13 | -0.75 |

12

DIGITAL WIRELESS COMMUNICATION APPARATUS

CROSS-REFERENCES TO RELATED APPLICATIONS

This application relates to and claims priority from Japanese Patent Application No. 2006-190775, filed on Jul. 11, 2006, the entire disclosure of which is incorporated herein by reference.

BACKGROUND

The present invention relates to digital wireless communication apparatus, and particularly relates to superior technology for suppressing click noise while maintaining call distance even when code errors occur in ADPCM code and alleviating deterioration in communication quality.

ADPCM (adaptive differential PCM) methods are often used as audio encoding methods for digital cordless telephones. ADPCM encoding methods have the property where click noise that is unexpectedly abrupt to the ear is generated when code errors occur when the influence of weak electric fields, phasing, and electromagnetic interference etc. is incurred so as to cause coding errors in audio data, thus causing audio quality to substantially deteriorate. In order to suppress this click noise, methods subjecting frame data where code errors have been detected by frame error checks such as Cyclic Redundancy Checks to muting processing are typical. However, in cases where there is one main unit acting as a base station as with a digital cordless telephone, there is the problem that the call distance is substantially limited. Further, this causes a voice to be suddenly muted during a call, which causes discomfort for the caller.

In order to resolve this problem, the applicant proposed digital wireless communication apparatus 300 shown in FIG. 8 (Japanese Patent Laid-open Publication No. 2006-50476). Digital wireless communication apparatus 300 is equipped with an ADPCM decoder 100, determination time adjustment section 200, code substituter 210, and error detector 220. The ADPCM decoder 100 is equipped with an adaptive de-quantizer 110, adaptive predictor 120, prediction signal limiter 130, regenerative signal calculator 140, output limiter 150, delay unit 160, quantization scale factor adapter 170, adaptive speed controller 180, and tone and changing point detector 190.

When error information is detected at the error detector 220, the determination time adjustment section 200 outputs an error detection signal indicating a frame period where code substitution processing may be validly executed to the code substituter 210. The code substituter 210 sequentially monitors a high-speed scale factor yu(k) and a low-speed scale factor yl(k) managed within the quantization scale factor adapter 170 every one sampling for data sections outputting error detection signals, and in the event that yl(k−1) for one sample previous exceeds one of a plurality of threshold values and y(k−1) of one sample previous exceeds a threshold value corresponding to l(k) and yl(k) at this time, it is predicted that click noise will occur, and l(k) is substituted with predetermined code l'(k).

The adaptive de-quantizer 110 then generates a quantization differential signal dq(k) based on ADPCM code l(k) (or l'(k)) and quantization scale factor y(k), and outputs the quantization differential signal dq(k) to the adaptive predictor 120, regenerative signal calculator 140, and tone and changing point detector 190.

The prediction signal limiter 130 compares a prediction signal se(k) and the value of a PCM output so(k−1) for one sample previous. In the event that the input signal is lower than a certain frequency so that so(k−1) is a maximum and se(k) is inverted code for so(k−1), or in the event that the input signal is higher than a certain frequency so that so(k−1) is a maximum and se(k) is a maximum of inverted code of so(k−1), it is predicted that this will generate click noise, se(k) is substituted with the same value as for so(k−1), and these are outputted as se'(k). The prediction signal limiter 130 outputs prediction signal se(k) as is to the regenerative signal calculator 140 when it is not necessary to carry out limiting processing.

The regenerative signal calculator 140 generates a regenerative signal sr(k) based on the quantization differential signal dq(k) and prediction signal se(k) (or se'(k)). The output limiter 14 compresses a regenerative signal sr(k) to a PCM signal so(k). Here, "k" is a variable indicating sampling time.

Further, detection of the input frequency is carried out by determining whether or not a convergent value of $a_1(k)$ exceeds a predetermined threshold value utilizing a frequency following characteristic of polar prediction function $a_1(k)$ shown in FIG. 9.

SUMMARY

However, the digital wireless communication apparatus 300 shown in FIG. 8 utilizes a frequency following characteristic of the polar prediction coefficient $a_1(k)$ of an input frequency for carrying out limit processing of the prediction signal. Therefore, when a saturation signal outside of the dynamic range is inputted to the ADPCM decoder 100, as shown in FIG. 10, a convergent value of polar prediction coefficient $a_1(k)$ corresponding to the input frequency becomes a value deviating from a normal value (convergent value of polar prediction coefficient $a_1(k)$ shown in FIG. 9). Prediction signal limiter 130 then carries out a frequency determination of the input signal based on the convergent value of polar prediction coefficient $a_1(k)$. When frequency determination is then carried out based on an erroneous value, this may potentially cause the click noise to be rejected as a result of prediction signal limit processing.

Further, discomfort will occur for a few hundred to a few thousand samples after even when correct code is received thereafter rather than directly after the erroneous detection in the click noise. There are also cases where rather than a code error occurring once being generated as click noise at this time, this error is accumulated across a few hundred to a few thousand samples so as to give code with a substantial differential for which click noise occurs. With this kind of click noise suppression, a period of a few thousand samples after error detection is necessary in order for a circuit for suppressing click noise to operate.

In this situation, carrying out the determination of the click noise from the relationship between frequency determination results of the saturation signal deviating from the dynamic range and the PCM output makes it easy for erroneous or non-detection to occur and invites deterioration of sound quality.

The present invention therefore tackles the problem of, in the event that encoding errors occur for various input signals, making it possible to suppress click noise occurring due to code that could not be predicted or click noise occurring due to correct code after a few hundred samples to a few thousand samples from a frame errors are detected for, and making it possible to suppress deterioration of communication quality.

In order to resolve the aforementioned problems, a digital wireless communication apparatus of the present invention is equipped with an ADPCM decoder for decoding ADPCM encoded audio data and detecting code errors of audio data. An ADPCM decoder is provided with a multiplier calculating a partial prediction signal composed of the product of a polar prediction coefficient for generating a regenerative signal and a quantized regenerative signal, a display conversion section for converting the partial prediction signal from floating point representation to an absolute value display, and a limiter executing processing for substituting limit values in the partial prediction signal satisfying overflow conditions during conversion of the partial prediction signal from floating point representation to an absolute value display in the event that the error detector determines that there is a code error in the audio data for a predetermined number of frames of the audio data. According to this configuration, it is possible to suppress overflow during conversion of a partial prediction signal from floating point representation to absolute value representation and click noise can be suppressed.

According to a further aspect of the present invention, an ADPCM decoder comprises a limiter executing processing for substituting limit values in the prediction signal satisfying overflow conditions during addition of all of the partial prediction signals for generating the prediction signal for a predetermined number of the audio data frames in the event that the error detector determines that a code error is present in the audio data. According to this configuration, it is possible to suppress overflow during generation of a prediction signal and click noise can therefore be suppressed.

According to the present invention, in the event that encoding errors occur for various input signals, it is possible to suppress click noise occurring due to code that could not be predicted or click noise occurring due to correct code after a few hundred samples to a few thousand samples from a frame errors are detected for, and it is possible to suppress deterioration of communication quality.

DESCRIPTION OF THE DRAWINGS

FIG. 2 is a detailed block view of an adaptive predictor with a limit function;

DETAILED DESCRIPTION

Figure 1:
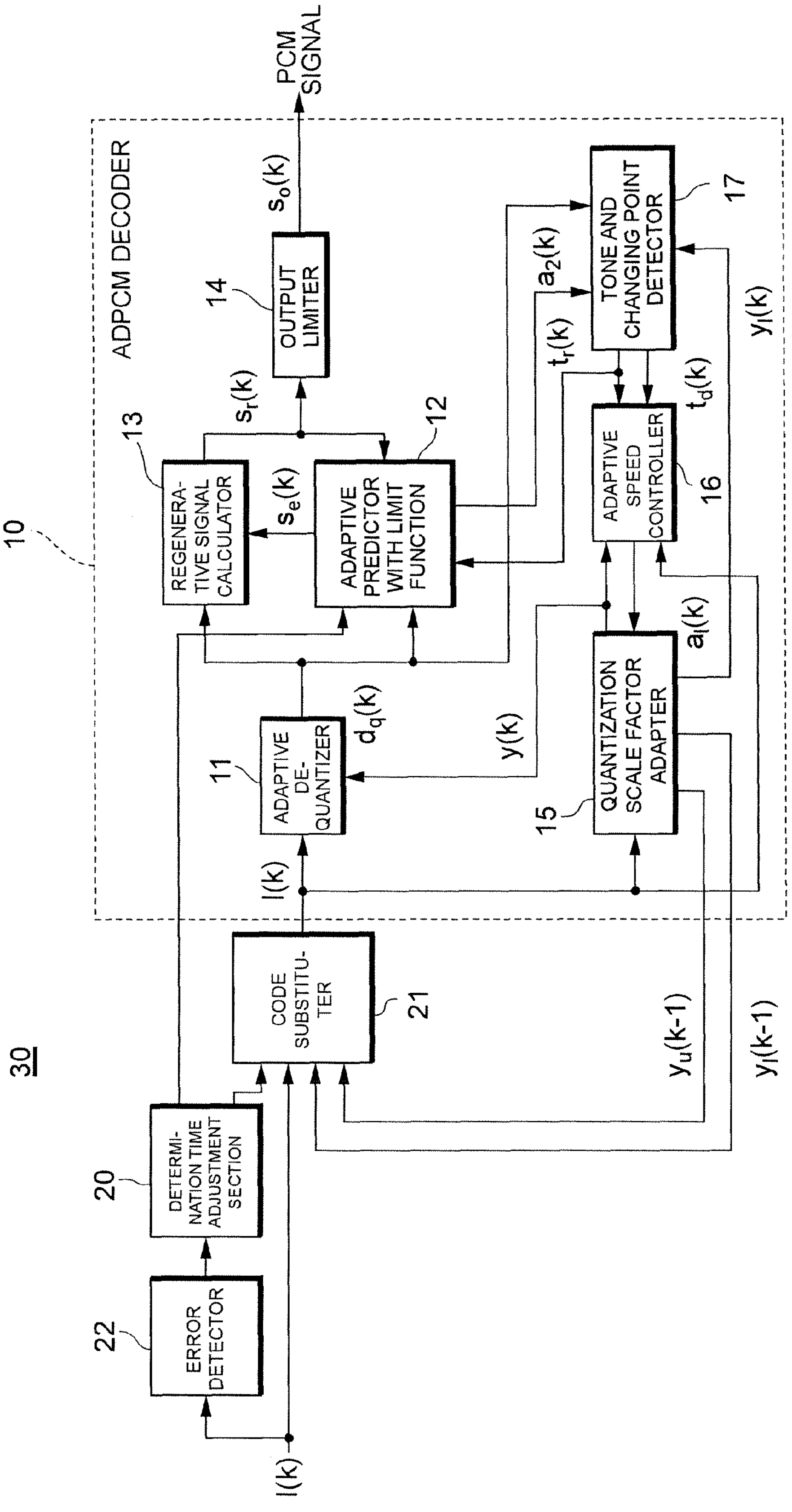
FIG. 1 is a system configuration of digital wireless communication apparatus of this embodiment.

FIG. 1 is a system configuration of digital wireless communication apparatus 30 of this embodiment. Digital wireless communication apparatus 30 is equipped with an ADPCM decoder 10, determination time adjustment section 20, code substituter 21, and error detector 22. The ADPCM decoder 10 is equipped with an adaptive de-quantizer 11, adaptive predictor 12 with a limit function, regenerative signal calculator 13, output limiter 14, quantization scale factor adapter 15, adaptive speed controller 16, and tone and changing point detector 17. Digital wireless communication apparatus 30 is, for example, a cordless telephone, etc.

When a frame error is detected in received ADPCM code l(k) by error detector 22 using a cyclic redundancy check, a frame error detection signal is outputted to determination time adjustment section 20. In the event that a frame error is detected, determination time adjustment section 20 outputs an error detection signal indicating a frame period (for example, a period from a few hundred to a few thousand samples) where click noise suppression processing is effective to code substituter 21 and adaptive predictor 12.

When an error detection signal is received from determination time adjustment section 20, in the event that predetermined conditions are satisfied based on the values of a high-speed scale factor yu(k), low speed scale factor yl(k) and ADPCM code l(k), the code substituter 21 substitutes ADPCM code l(k) with predetermined code l'(k) across a frame period indicated by the error detection signal from the determination time adjustment section 20. The details of processing for substituting ADPCM code l(k) with predetermined code I'(k) are disclosed in Japanese Patent Laid-open Publication No. 2006-50476 and are not described here.

ADPCM code l(k) is for performing encoding and transfer after a differential signal d(k) for a prediction signal and a quantized PCM signal is quantized on the transmission side. Namely, at the adaptive quantizer on the transmission side, the differential signal d(k) is converter to a logarithm taking 2 as a base, and is then normalized by scale factor y(k). The value of the $\log_2 (d(k))-y(k)$ obtained in this way is then quantized, and ADPCM code l(k) is generated by code substitution.

The adaptive de-quantizer 11 then generates a quantization differential signal dq(k) based on ADPCM code l(k) (or l'(k)) and quantization scale factor y(k), and outputs the quantization differential signal dq(k) to the adaptive predictor 12 with a limit function, regenerative signal calculator 13, and tone and changing point detector 17.

The adaptive predictor 12 with a limit function generates a prediction signal se(k) and polar prediction coefficient a2(*k*) based on quantization differential signal dq(k) and speed variable tr(k). The adaptive predictor 12 with a limit function executes limiting processing for suppressing click noise for an internal variable (partial prediction signal) for generating the prediction signal se(k) across a frame period indicated by an error detection signal from the determination time adjustment section 20.

The regenerative signal calculator 13 generates a regenerative signal sr(k) based on the quantization differential signal dq(k) and prediction signal se(k).

Output limiter 14 compresses a regenerative signal sr(k) to a PCM signal so(k).

Quantization scale factor adapter 15 generates scale factor y(k), high-speed scale factor yu(k) and low-speed scale factor yl(k) based on the ADPCM code l(k) (or l'(k)) and adaptive speed control variable al(k).

The scale factor y(k), high-speed scale factor yu(k) and low-speed scale factor yl(k) are generated as shown in the following equation.

$$y(k)=al(k)\cdot yu(k-1)+[1-al(k)]\cdot yl(k-1)$$

$$yu(k)(1-2^{-5})\cdot y(k)+2^{-5}\cdot W[I(k)]$$

$$yl(k)(1-2^{-6})\cdot yl(k)+2^{-6}\cdot yu(k)$$

Figure 3:
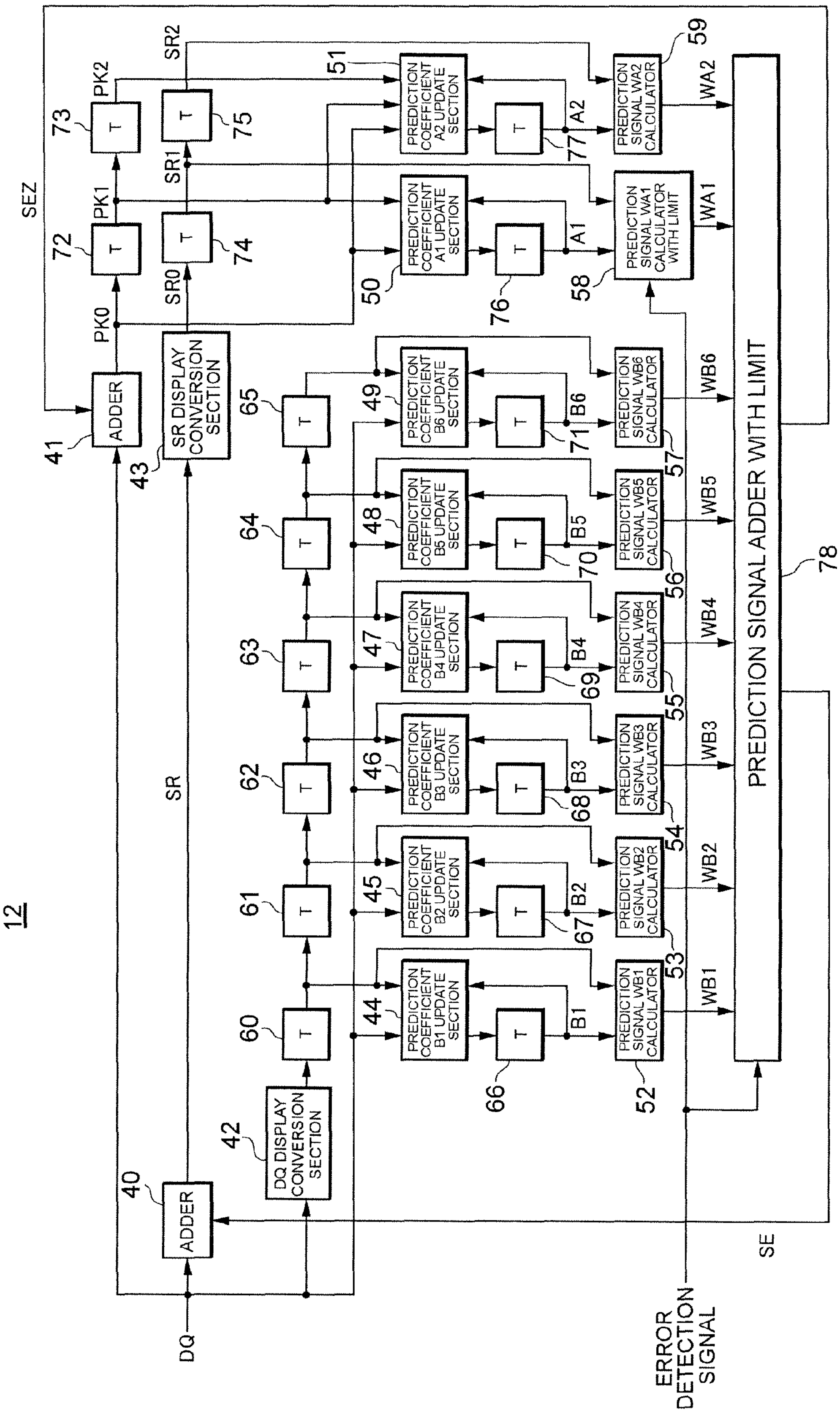
FIG. 3 is a table showing the corresponding relationship of the absolute value of l(k) and W[l(k)]

The value of W[l(k)] is defined as shown in FIG. 3. The high-speed scale factor yu(k) corresponds to a signal (for example, audio signal) where l(k) exhibits a large fluctuation, and the low-speed scale factor yl(k) corresponds to a signal (for example, tone signal) where l(k) exhibits a small amount of fluctuation.

Quantization scale factor adapter 15 outputs the scale factor y(k) to adaptive de-quantizer 11 and outputs low-speed scale factor yl(k) to the tone and changing point detector 17. Further, quantization scale factor adapter 15 outputs a high-speed scale factor yu(k−1) for one sample previous and low-speed scale factor yl(k−1) to code substituter 21.

Adaptive speed controller 16 generates an adaptive speed control variable al(k) based on the scale factor y(k), ADPCM code l(k) (or l'(k)), speed variable tr(k), and control variable td(k). The tone and changing point detector 17 generates a speed variable tr(k) and control variable td(k) based on the polar prediction coefficient a2($k$), quantization differential signal dq(k), and low-speed scale factor yl(k).

The above signals are all sampled digital signals with the character k within parenthesis for each signal indicating sampling time.

FIG. 2 shows a detailed block view of an adaptive predictor 12 with a limit function. The principle function of the adaptive predictor 12 with a limit function is to calculate the prediction signal se(k) from the quantized differential signal dq(k). The prediction signal se(k) is calculated from eight partial prediction signals. Six partial prediction signals (prediction signal WB1 to WB6) of the eight partial prediction signals are calculated by six order zero predictors (prediction coefficient updating sections 44 to 49, prediction signal calculators 52 to 57, and delay elements 60 to 71), with the remaining two partial prediction signals (prediction signal WA1 to WA2) being calculated from second order polar predictors (prediction coefficient updating sections 50 to 51, prediction signal calculators 58 to 59, and delay elements 72 to 77).

Prediction signal $s_e(k)$ is calculated as follows.

$$s_e(k)=\sum_{i=1}^{2}a_i(k-1)s_r(k-i)+s_{ez}(k)$$

Here, $s_{ez}(k)$ is calculated as follows.

$$s_{ez}(k)=\sum_{i=1}^{6}b_i(k-1)d_q(k-i)$$

Further, regenerative signal $s_r(k)$ is defined as follows.

$$s_r(k-i)=s_e(k-i)+d_q(k-i)$$

With either prediction coefficient, sequential updating employing the simplified gradient method takes place.

In FIG. 2, DQ is $d_q(k)$ quantized, and SE is se(k) quantized. SEZ is sez(k) quantized, and B1 to B6 and A1 to A2 are polar prediction coefficients quantized. PKO indicates DQ+SEZ, PK1 indicates a signal for one sample previous of PK0, and PK2 indicates a signal for one sample previous for PK1. SRO is SR with the display format converted, SR1 indicates the signal for one sample previous of SR9, and SR2 indicates the signal for one sample previous of SR1. Further, numeral 40 and 41 indicate adders, numeral 42 indicates a DQ display conversion section, numeral 43 indicates an SR display conversion section, numeral 44 to 49 indicate prediction coefficient update sections for B1 to B6 respectively, numeral 50 and 51 indicate prediction coefficient update sections for A1 to A2, numeral 52 to 57 indicate prediction signal calculators for WB1 to WB2, numeral 58 and 59 indicate prediction signal calculators for WA1 to WA2, numeral 60 to 77 indicate delay elements for the time of one sample, and numeral 78 indicates the prediction signal adder with a limit function.

Figure 4:
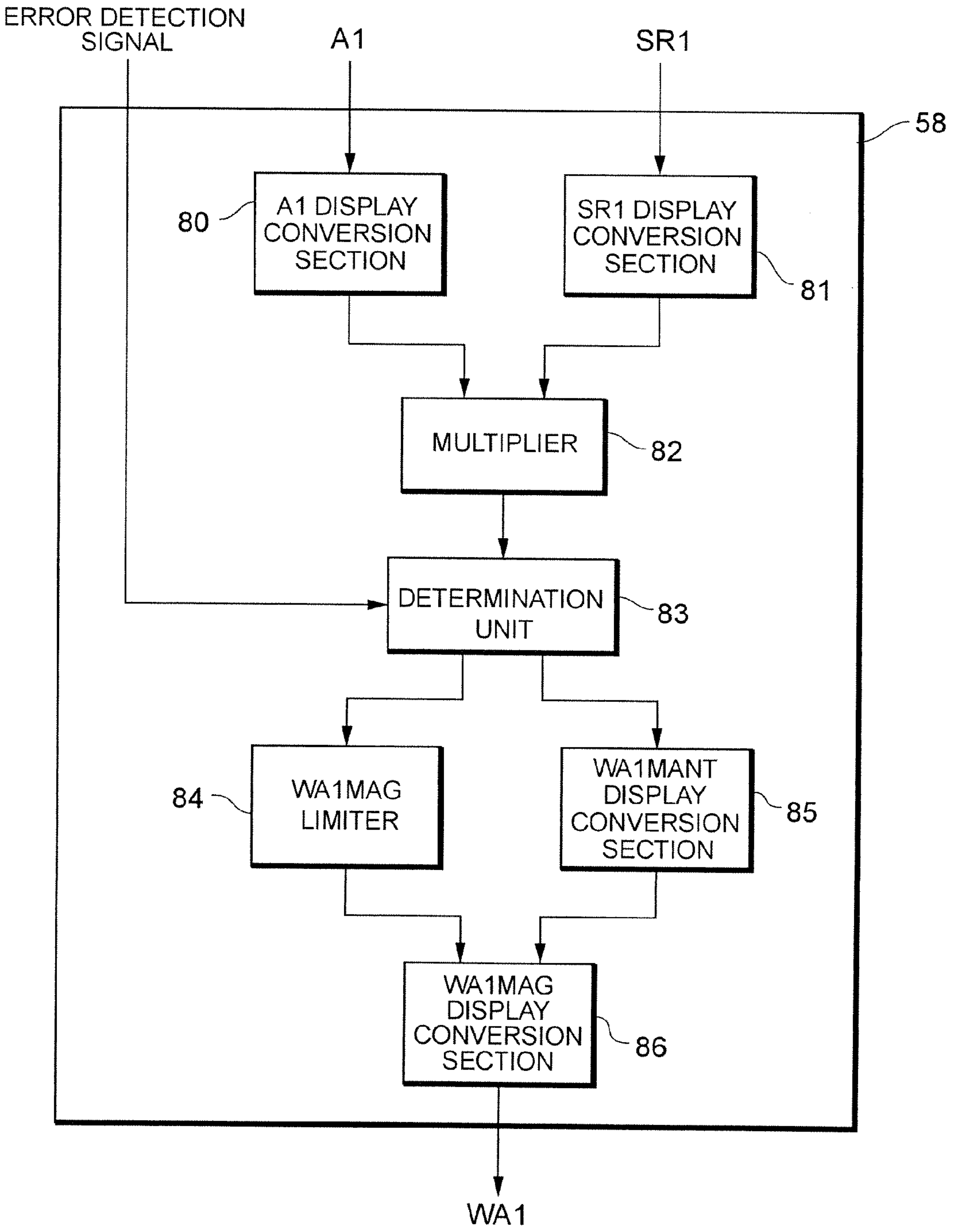
FIG. 4 is a detailed block view of a prediction signal calculator with a limit function.

FIG. 4 shows a detailed block view of a prediction signal WA1 calculator 58 with a limit function. The prediction signal WA1 calculator 58 with a limit function is comprised of A1 display converter 80, SR1 display converter 81, multiplier 82, determination unit 83, WA1MAG limiter 84, WA1MANT display converter 85, and WA1MAG display converter 86.

The A1 display converter 80 converts a polar prediction coefficient A1 to floating point representation. The SR1 display converter 81 converts a regenerative signal SR1 to floating point representation. The multiplier 82 multiplies the polar prediction coefficient A1 and the regenerative signal SR1. WA1MANT display converter 85 converts the multiplication results from a floating point representation to an absolute value display. WA1MAG display converter 86 converts the multiplication results from an absolute value display to a two's compliment display and outputs this as prediction signal WA1.

WA1MANT display converter 85 then converts the floating point representation to an absolute value display in accordance with the following equation.

When WA1EXP<=26, $$WA1MAG=(WA1MANT<<7)>>(26-WA1EXP)$$

When WA1EXP>26, $$WA1MAG=(WA1MANT<<7)<<(WA1EXP-26)$$

WA1EXP indicates a floating point representation exponent section (maximum value 28) for prediction signal WA1, WA1MANT indicates a floating point representation mantissa section (eight bit) for prediction signal WA1, and WA1MAG indicates an absolute value display (fifteen bit) for prediction signal WA1.

Figure 5:
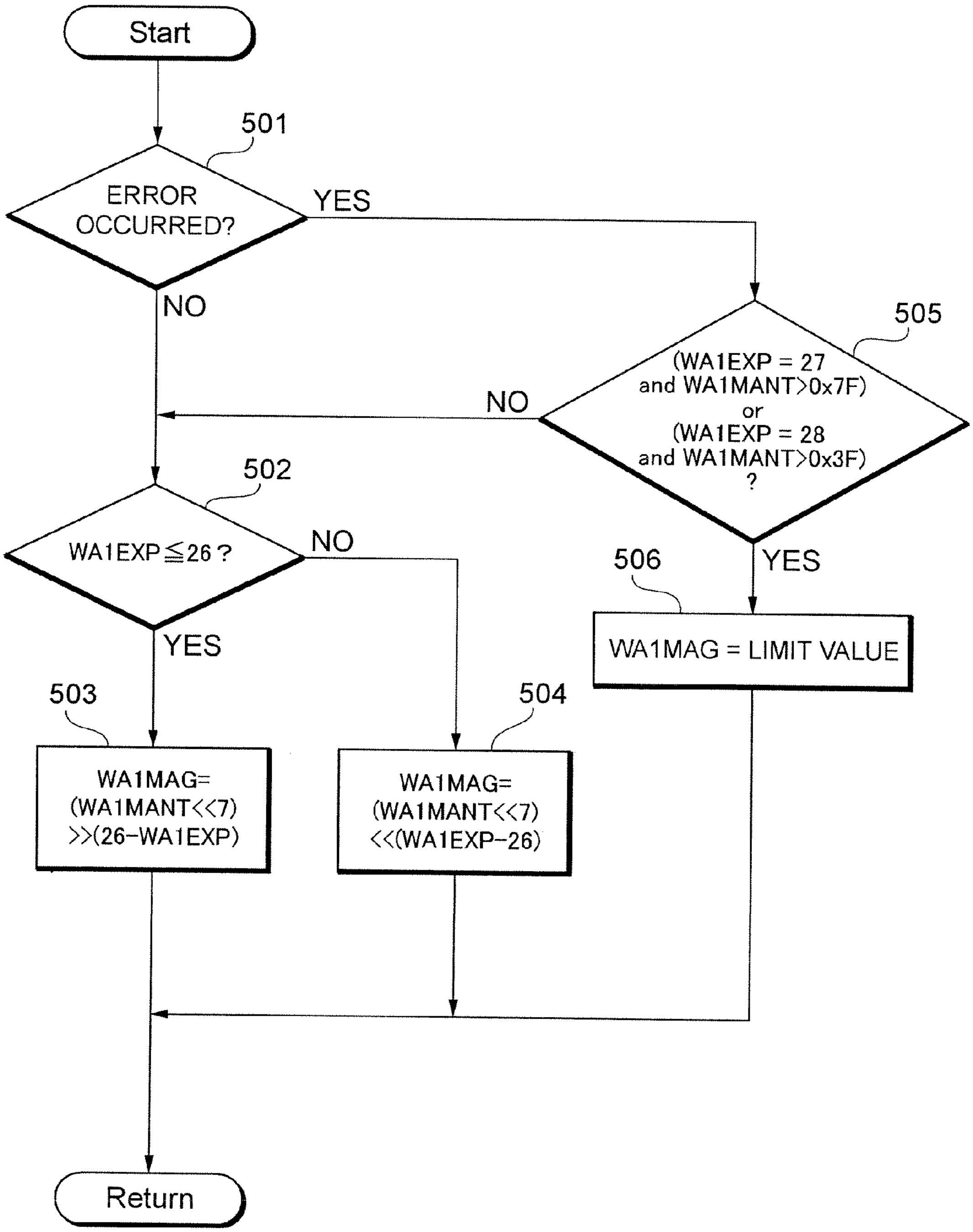
FIG. 5 is a flowchart showing limiting processing executed by the prediction calculator with a limit function.

Here, the amount of left shift of WA1MANT is considered. WA1MAG is 15 bit data and no problems occur if the amount of left shift of WA1MANT of the eight bits of data is up to seven bits. However, in the event that a maximum value of 28 is taken and the value of WA1EXP is 27 or 28, WA1MANT is shifts eight or nine bits to the left. The most significant bit of WA1MANT is therefore shifted out due to the value of WA1MANT The prediction signal WA1 calculator 58 with a limit function therefore executes the limit processing shown in FIG. 5. Determination unit 83 determines whether or not an error detection signal is received from determination time adjustment section 20 (step 501). As described above, this error detection signal indicates a frame period where click noise suppression processing is effective.

If a frame error has not occurred (step 501; NO), determination unit 83 determines whether or not the value of WA1EXP is 26 or less (step 502). If the value of WA1EXP is 26 or less (step 502; YES), WA1MANT display converter 85 executes calculation of WA1MAG=(WA1MANT<<7)>>(26-WA1EXP) (step 503). On the other hand, if the value of WA1EXP is 27 or 28 (step 502; NO), WA1MANT display converter 85 executes the calculation of WA1MAG=(WA1MANT<<7)<<(WA1EXP−26) (step 504).

If a frame error occurs (step 501; YES). determination unit 83 determines whether the value of WA1EXP is 27 and the value of WA1MANT is larger than 0x7F, or the value of WA1EXP is 28 and the value of WA1MANT is larger than 0x3F (step 505). In the event that the value of WA1EXP is 27 and the value of WA1MANT is 0x7F or less, or in the event that the value of WA1EXP is 28 and the value of WA1MANT is 0x3F or less, the processing of step 502 is executed.

Figure 6:
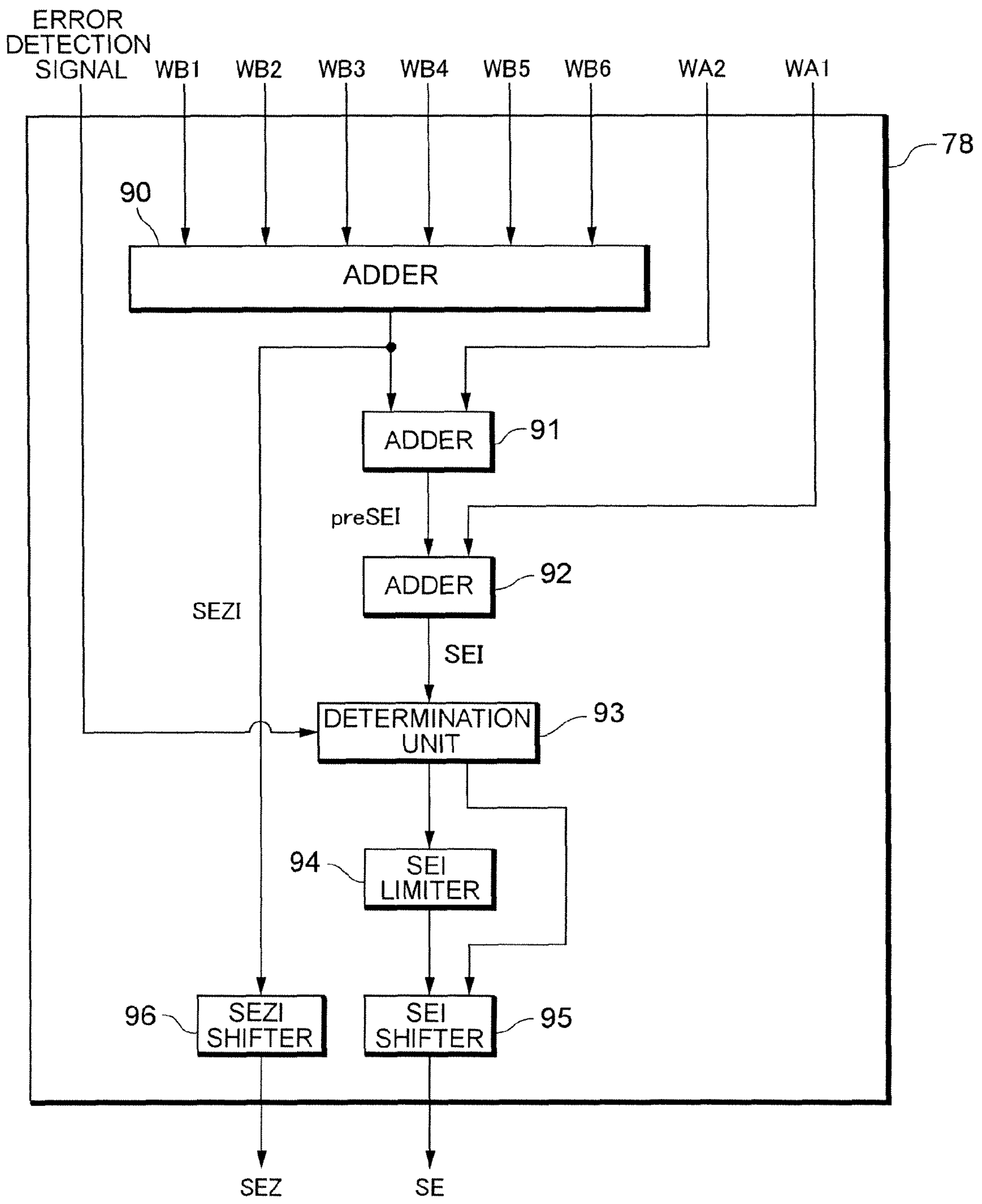
FIG. 6 is a detailed block view of a prediction signal adder with a limit function.

In the event that the value of WA1EXP is 27 and the value of WA1MANT is larger than 0x7F, or the value of WA1EXP is 28 and the value of WA1MANT is larger than 0x3F (step 505; YES), when the calculation of WA1MAG=(WA1MANT<<7)<<(WA1EXP−26) is executed, the uppermost bit of WA1MANT shifts out to the left and WA1MAG limiter 84 therefore substitutes a predetermined limit value (for example, 0x7F00) in WA1MAG FIG. 6 shows a detailed block view of a prediction signal adder 78 with a limit function. The prediction signal adder 78 with a limit function is equipped with adders 90 to 92, a determination section 93, SEI limiter 94, SEI shifter 95, and SEZI shifter 96.

The adder 90 adds prediction signals WB1 to WB6 and outputs the results of this addition as SEZI. The SEZI shifter 96 shifts SEZI one bit to the right, and outputs the result as SEZ. The adder 91 adds SEZ1 and WA2 and outputs the results of this addition as preSEI. The adder 92 adds preSEI and WA1 and outputs the results of this addition as SEI. The SEI shifter 95 shifts SEZ one bit to the right, and outputs the result as SE.

The process of adding preSEI and WA1 is now considered. As described above, under certain conditions (step 505; YES), a limit value is substituted at WA1MAG In doing so, when preSEI and WA1 are added, it is possible that SEI may overflow.

Figure 7:
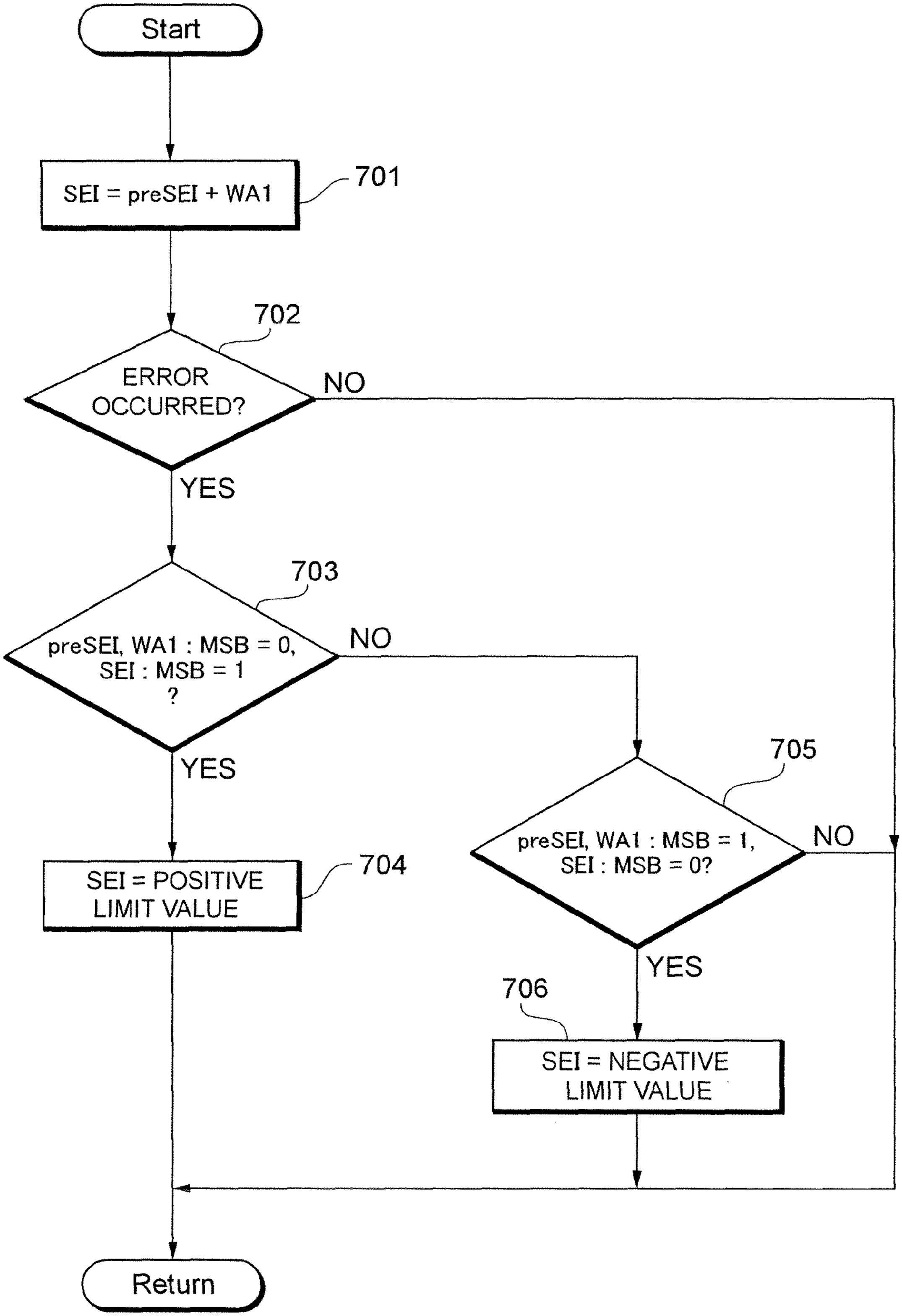
FIG. 7 is a flowchart showing limiting processing executed by the prediction signal adder with a limit function.
Figure 8:
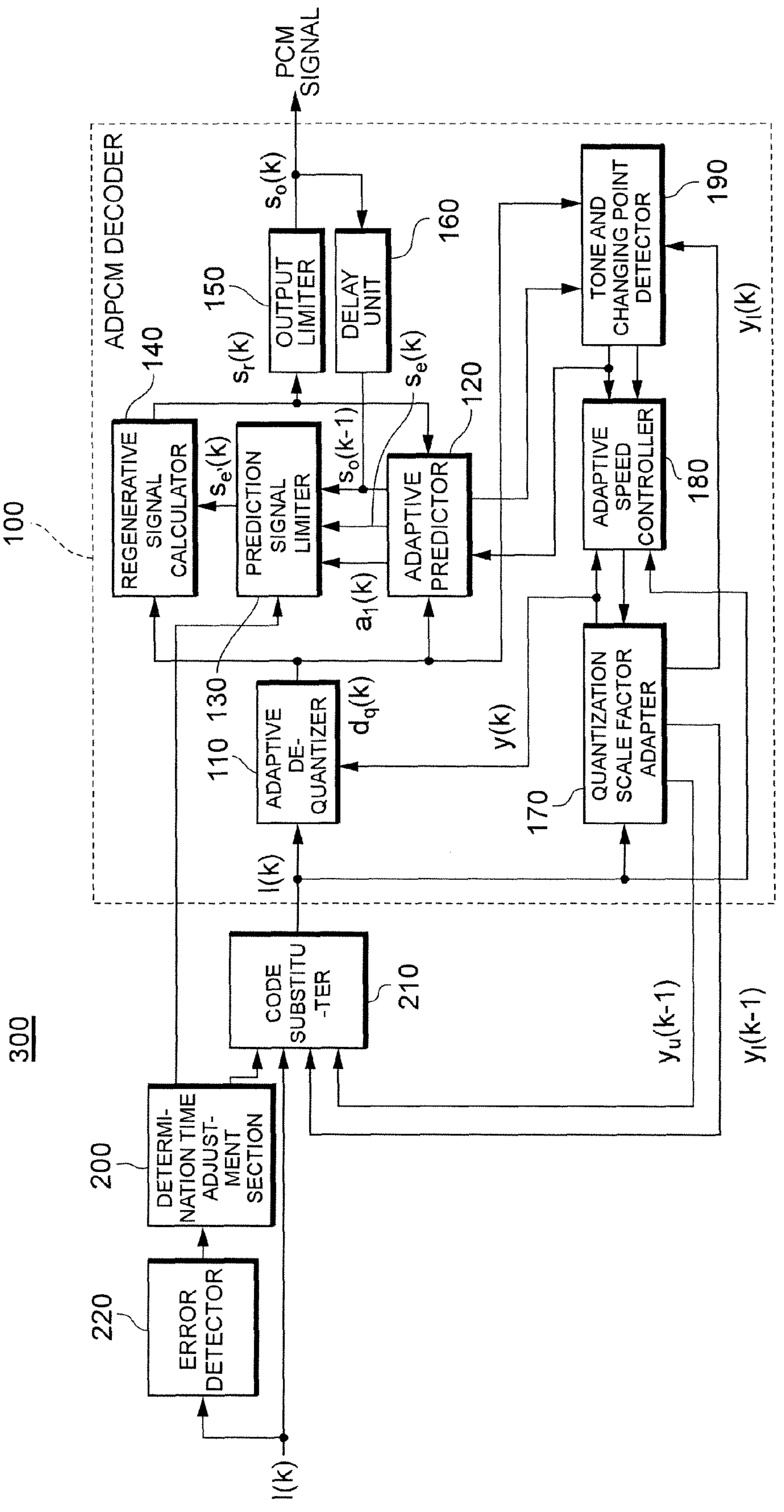
FIG. 8 PRIOR ART
FIG. 8 is a system configuration of digital wireless communication apparatus of the related art.
Figure 9:
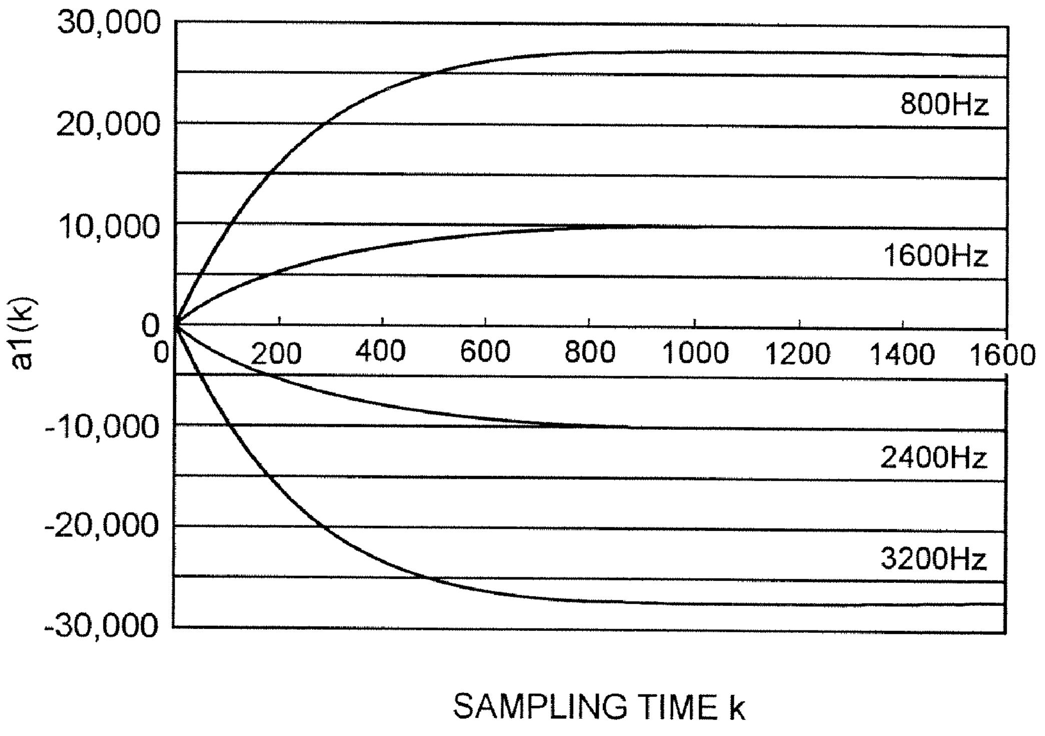
FIG. 9 PRIOR ART
FIG. 9 is a graph showing a frequency following characteristic of polar prediction coefficient $a_1(k)$.
Figure 10:
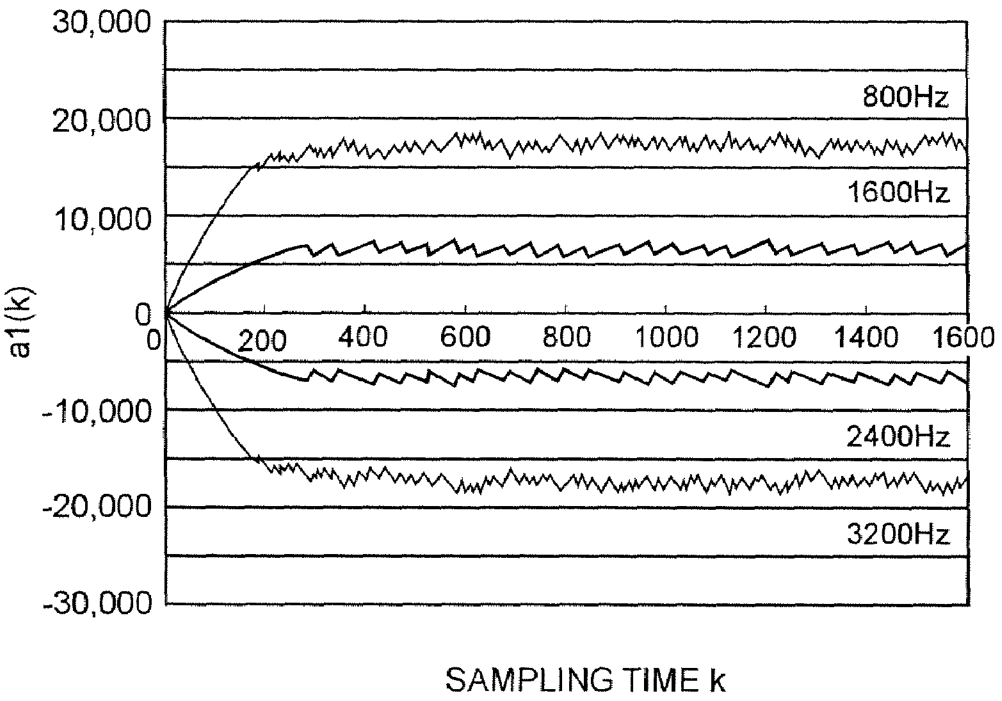
FIG. 10 PRIOR ART
FIG. 10 is a graph showing a frequency following characteristic of the polar prediction coefficient $a_1(k)$ when a saturation signal is inputted.

The prediction signal adder 78 with a limit function therefore executes the limit processing shown in FIG. 7. The adder 92 adds preSEI and WA1(step 701). Determination unit 93 determines whether or not an error detection signal is received from determination time adjustment section 20 (step 701). In the event that an error detection signal is not received (step 702; NO), prediction signal adder 78 with a limit function omits the processing routine.

In the event that an error detection signal is received (step 702; YES), the determination unit 93 determines whether or not the most significant bits of preSEI and WA1 are 9, and that the most significant bit of SEI is 1 (step 703). In the event that the most significant bits of preSEI and WA1 are 0 and the most significant bit of SEI is 1 (step 703; YES), it is shown that SEI code is determined as a result of the overflow, and SEI limiter 94 substitutes a positive limit value (for example, 0x7FF) in SEI (step 704).

In the event that the most significant bits for preSEI and WA1 respectively are 0 and the most significant bit of SEI is 0 (step 703; NO), the determination unit 93 determines whether or not the most significant bits of preSEI and WA1 are 1 and the most significant bit of SEI is 0 (step 705). In the event that the most significant bits of preSEI and WA1 are 1 and the most significant bit of SEI is 0 (step 705; YES), it is shown that SEI code is determined as a result of the overflow, and SEI limiter 94 substitutes a negative limit value (for example, 0x800) in SEI (step 706).

In the event that the most significant bits of preSEI and WA1 are 1 and the most significant bit of SEI is not 0 (step 705; NO), prediction signal adder 78 with a limit function omits the processing routine.

According to this embodiment, in the event that encoding errors occur for various input signals, it is possible to suppress click noise occurring due to code that could not be predicted or click noise occurring due to correct code after a few hundred samples to a few thousand samples from a frame errors are detected for, and it is possible to suppress deterioration of communication quality.

What is claimed is:

1. Digital wireless communication apparatus with an ADPCM decoder decoding ADPCM encoded audio data, and an error detector detecting coding errors of the audio data, the ADPCM decoder comprising:

a multiplier calculating a partial prediction signal composed of the product of a polar prediction coefficient for generating a regenerative signal and a quantized regenerative signal;

a display conversion section for converting the partial prediction signal from floating point representation to an absolute value display; and a limiter executing processing for substituting limit values in the partial prediction signal satisfying overflow conditions during conversion of the partial prediction signal from floating point representation to an absolute value display in the event that the error detector determines that there is a code error in the audio data for a predetermined number of frames of the audio data.

2. Digital wireless communication apparatus with an ADPCM decoder decoding ADPCM encoded audio data, and an error detector detecting coding errors of the audio data, the ADPCM decoder comprising a limiter executing processing for substituting limit values in the prediction signal satisfying overflow conditions during addition of all of the partial prediction signals for generating the prediction signal for a predetermined number of the audio data frames in the event that the error detector determines that a code error is present in the audio data.

* * * * *